United States Patent
Wang

(10) Patent No.: US 10,290,497 B2
(45) Date of Patent: May 14, 2019

(54) FABRICATION OF SEMI-POLAR CRYSTAL STRUCTURES

(71) Applicant: Seren Photonics Limited, Bridgend (GB)

(72) Inventor: Tao Wang, Sheffield (GB)

(73) Assignee: SEREN PHOTONICS LIMITED, Bridgend Mid Glamorgan (GB)

(*) Notice: Subject to any disclaimer, the term of this patent is extended or adjusted under 35 U.S.C. 154(b) by 157 days.

(21) Appl. No.: 15/317,137

(22) PCT Filed: Jun. 8, 2015

(86) PCT No.: PCT/GB2015/051667
§ 371 (c)(1),
(2) Date: Dec. 8, 2016

(87) PCT Pub. No.: WO2015/189582
PCT Pub. Date: Dec. 17, 2015

(65) Prior Publication Data
US 2017/0125245 A1    May 4, 2017

(30) Foreign Application Priority Data
Jun. 9, 2014 (GB) .................... 14103200.8

(51) Int. Cl.
*C30B 25/02*     (2006.01)
*H01L 21/02*     (2006.01)
(Continued)

(52) U.S. Cl.
CPC .... *H01L 21/02639* (2013.01); *H01L 21/0243* (2013.01); *H01L 21/0254* (2013.01);
(Continued)

(58) Field of Classification Search
CPC ......... C30B 25/02; C30B 25/04; C30B 23/04; C30B 29/38
See application file for complete search history.

(56) References Cited

U.S. PATENT DOCUMENTS 6,635,901 B2 * 10/2003 Sawaki ................... H01L 33/16
                                                              257/103
6,888,867 B2    5/2005 Sawaki et al.
(Continued)

FOREIGN PATENT DOCUMENTS

| CN | 101651181 A | 2/2010 |
|---|---|---|
| CN | 102214557 A | 10/2011 |
| JP | 2008305977 A | 12/2008 |

OTHER PUBLICATIONS

Bai, J. et al., "Growth and Characterization of Semi-Polar (11-22) GaN on Patterned (113) Si Substrates," Semiconductor Science and Technology, Jun. 2015, p. 065012, vol. 30, No. 6.
(Continued)

*Primary Examiner* — Robert M Kunemund
(74) *Attorney, Agent, or Firm* — William J. Clemens; Shumaker, Loop & Kendrick, LLP

(57) ABSTRACT

A method of growing a group III nitride crystal structure comprises: providing a silicon substrate (12); forming a first mask (10) on the substrate, the mask having a plurality of apertures (14) through it each exposing a respective area of the silicon substrate; etching the silicon exposed by each of the apertures to form a respective recess (16) having a plurality of facets (18, 20, 22, 24); depositing a second mask over some of the facets of each recess leaving at least one of the facets (22) of each recess exposed; and growing group III nitride on the exposed facets (22) and then over the substrate to form a continuous layer.

9 Claims, 2 Drawing Sheets

(51) Int. Cl.
*H01L 21/308* (2006.01)
*H01L 29/20* (2006.01)

(52) U.S. Cl.
CPC .. *H01L 21/02381* (2013.01); *H01L 21/02433* (2013.01); *H01L 21/02458* (2013.01); *H01L 21/02609* (2013.01); *H01L 21/02647* (2013.01); *H01L 21/02658* (2013.01); *H01L 21/308* (2013.01); *H01L 29/2003* (2013.01)

(56) References Cited

U.S. PATENT DOCUMENTS

| | | |
|---|---|---|
| 2002/0074561 A1 | 6/2002 | Sawaki et al. |
| 2003/0031219 A1 | 2/2003 | Sawaki et al. |
| 2003/0178702 A1 | 9/2003 | Sawaki et al. |
| 2010/0032700 A1 | 2/2010 | Yu et al. |
| 2013/0087763 A1 | 4/2013 | Kim et al. |

OTHER PUBLICATIONS

Sawaki, N., "Selective MOVPE of III-Nitrides and Device Fanrication on an Si Substrate," Proceedings of SPIE, 2009, pp. 727902-1-727902-1, vol. 7279.

Tanikawa, T. et al., "Growth of Non-Polar (11-20) GaN on a Patterned (110) Si Substrate by Selective MOVPE," Journal of Crystal Growth, Elsevier, Nov. 11, 2008, pp. 4999-5002, vol. 310, No. 23.

* cited by examiner

FABRICATION OF SEMI-POLAR CRYSTAL STRUCTURES

FIELD OF THE INVENTION

The present invention relates to the growth of non-polar and semi-polar crystal structures, and templates including such structures. It has particular application in the growth of semi-polar or non-polar GaN on silicon, but can also be used for other group III nitrides, such as semi-polar aluminium nitride (AlN), semi-polar aluminium gallium nitride (Al-GaN), or semi-polar indium gallium nitride (InGaN).

BACKGROUND TO THE INVENTION

The last four decades have seen an unparalleled impact on semiconductor industry generated by silicon technology, accounting for over 90% of the global semiconductor market. Given the mature and cost-effective technology based on silicon, the unification of Group III-V technologies with silicon technology has potential to provide a very good solution to the integration of semiconductor based electronics and photonics. General illumination consumes 19% of the world's total energy consumption. Due to a significantly increasing demand for energy-efficient technologies as a result of energy shortage and climate change, it is necessary to develop energy-efficient solid-state lighting sources based on white light emitting diodes (LEDs) in order to replace incandescent and fluorescent lights. Fabrication of white LEDs is mainly on III-nitride semiconductors. Major achievements achieved so far in the fields of III-nitrides are mainly limited to the growth on (0001) sapphire, the polar orientation. This generates a polarization issue, thus leading to piezoelectric electric fields. As a result devices exhibit a reduced overlap between the electron and hole wavefunctions, leading to a long radiative recombination time and thus low quantum efficiency.

The growth of GaN on silicon (i.e. GaN-on-Si technology) is coming up, but is also limited to polar c-plane GaN. The material issues which result from using the GaN-on-Si technology become even more severe compared with GaN-on-sapphire. Therefore, it is desirable to develop a new growth technology in order to achieve high crystal quality semi- or non-polar GaN on silicon, the most promising approaches to overcome the issue of the internal electric fields and thus achieving a step change in IQE.

In the last decade, several groups worldwide have devoted considerable effort to the development of semi/non polar GaN on silicon. However, the results are far from satisfactory due to a number of challenges which are heavily restricting development of semi/non polar GaN on silicon.

Unlike sapphire substrates, it is extremely difficult to obtain non/semi-polar GaN on any planar silicon substrate. So far, semi-polar GaN on silicon (including (11-22) and (1-101) orientations) can be obtained only through growth on patterned silicon substrates, for instance, anisotropy wet etching (113) silicon using KOH to fabricate a regular silicon pattern with inclined strips with a (1-11) facet which is at 58° to the surface of (113) silicon, where the GaN growth is performed on the (1-11) silicon facets selectively in order to form semi-polar GaN.

It is well-known that the growth of GaN on silicon needs to avoid a so-called "Ga melting-back" etching issue. This is due to a strong chemical reaction between the grown GaN and silicon, leading to a poor surface morphology and eventually growth collapse. For a planar silicon substrate, it is easy to sort out simply through an initial deposition of AlN buffer layer which can completely separate GaN layer from silicon substrate, such as polar c-plane GaN on (111) silicon. However, for the growth on the patterned (113) silicon with the inclined strips, unavoidably a large number of residual voids are generated during the growth, leaving the grown GaN to directly contact silicon (see FIG. 1). The melting-back etching increases with increasing growth temperature. The current solution is to reduce the growth temperature down to a point which is not accepted for GaN epitaxial growth in order to suppress the melting-back etching. As a result, the crystal quality is far from satisfactory.

A two-step selective growth method as illustrated in FIG. 1 was proposed by Amano at Nagoya (1 T Murase, T Tanikawa, Y Honda, M Yamaguchi, H Amano and N Sawaki, Jpn. J. Appl. Phys. 50, 01AD04 (2011)). A triangle GaN stripe template was prepared on inclined (1-11) strip facets on (113) silicon using the same approach discussed above, followed by a deposition of a layer of $SiO_2$ mask in order to selectively cover the triangle GaN stripes for further regrowth, where the regrowth will occur on the uncovered areas selectively. They achieved very impressive results. However, the approach had some problems. First, the melting-back issue has not yet been solved. Second, for the selective regrowth, the small (0001) face at the edge of the triangle GaN stripes needs to be carefully covered by $SiO_2$ (dashed circle in FIG. 1) in order to avoid any growth along (0001). This has proved extremely difficult.

SUMMARY OF THE INVENTION

The present invention provides a method of growing a semi-polar or non-polar group III nitride crystal, or template, comprising: providing a silicon substrate; forming a first mask on the substrate, the mask having a plurality of apertures through it each exposing a respective area of the silicon substrate; etching the silicon exposed by each of the apertures to form a respective recess having a plurality of facets; depositing a second mask over some of the facets of each recess leaving at least one of the facets of each recess exposed; and growing group III nitride on the exposed facets. The method may further comprise growing the group III nitride over the substrate to form a continuous layer. Where any mask material is left on the substrate between the recesses, the growth may not be directly on the surface of the substrate, but also over that mask material. The layer may extend over a plurality of the recesses, and may extend over all of the recesses.

The first mask may be removed before growing the group III nitride.

The etching may be performed using anisotropic wet etching, for example using KOH as the etchant.

Each of the facets of each of the recesses may be substantially triangular or trapezoidal. Each recess tapers to a point at its bottom. Each facet may be inclined to the horizontal plane such that it faces partly upwards. Each aperture may therefore have no overhanging side.

Only one facet in each recess may be left exposed for the growth of group III nitride thereon.

Each recess may have a (1-11) facet which is left exposed for growth of group III nitride thereon.

The group III nitride may grow initially as (0001) group III nitride on the (1-11) silicon facet of each recess. The group III nitride may then grow out of the recesses and merge to form a single layer of (11-22) group III nitride. In other embodiments the final group III nitride layer may be (1-101) group III nitride on (001) Si, or (11-20) polar group III nitride on (110) Si.

The group III nitride may be GaN, or InGaN, or AlGaN, or ALN.

A buffer layer may be deposited on the exposed facets prior to the growth of group III nitride.

The apertures may be arranged in a regular 2D array, such as a square array, a rectangular array, a hexagonal array, an inclined array, or a centred rectangular (or rhombic) array. In some cases less regular, or irregular arrays can be used. Each of the apertures may be square, rectangular, triangular, hexagonal, or circular.

The present invention further provides a template comprising a silicon substrate with a layer of group III nitride on the substrate, wherein the substrate has an array of recesses formed in it each having a plurality of facets, some of the facets having a mask thereon, and at least one of the facets in each recess having the group III nitride grown onto it, and the group III nitride forming a layer covering the array of recesses. The group III nitride may be semi-polar, or indeed non-polar or polar.

The method, or template, may further comprise, in any combination, any one or more of the features of the preferred embodiments of the invention, which will now be described, by way of example only, with reference to the accompanying drawings.

DESCRIPTION OF THE PREFERRED EMBODIMENTS

Figure 2A:
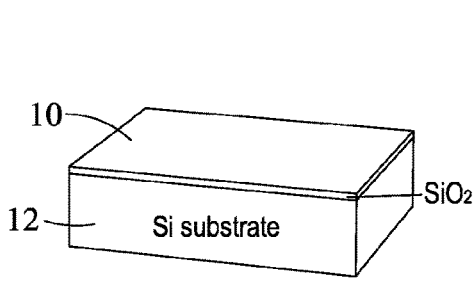
FIGS. 2a to 2e show the steps in a growth method according to an embodiment of the invention.
Figure 2B:
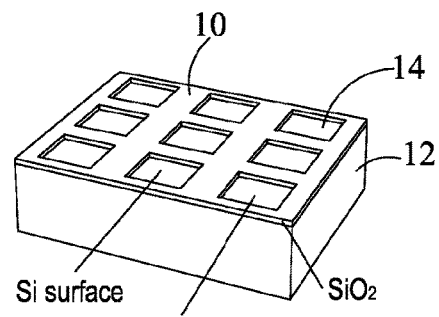
Figure 2C:
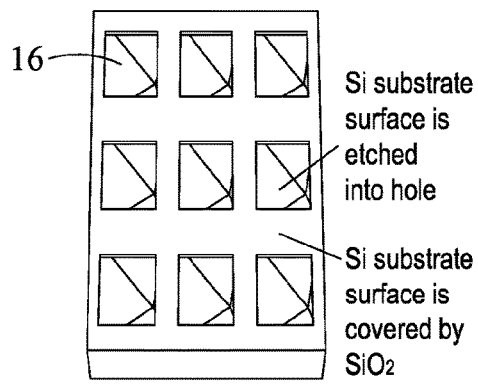
Figure 2D:
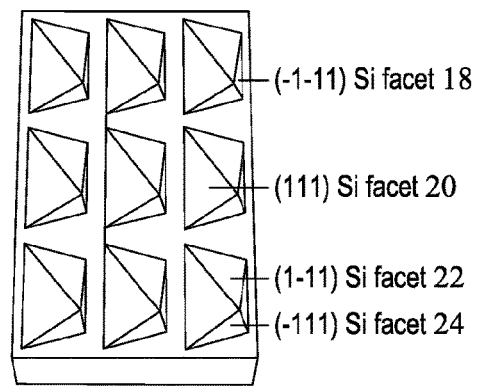

Referring to FIGS. 2a to 2e a method for the fabrication of an atomically flat (11-22) GaN template on (113) silicon will now be described. Firstly a (113) silicon substrate, i.e. a silicon substrate having a flat surface in the (113) plane of its crystal structure, is provided. As shown in FIG. 2a, a $SiO_2$ thin film 10 is deposited on the surface of the (113) silicon substrate 12 by plasma-enhanced chemical vapour deposition (PECDV). In other embodiments the $SiO_2$ may be deposited using electron-beam evaporator or sputtering deposition. Then, as shown in FIG. 2b, an array of windows 14, in this embodiment a regular square array of 2×2 μm size square windows (though, the window size could be smaller or larger from 500×500 nm to 10×10 μm) with a separation, of about 1 μm (though the separation could be from 100 nm to 5 μm), are opened across the whole wafer using a standard photolithography and dry etching technique (in this case reactive ion etching RIE) to etch through the $SiO_2$ film. The window could be rectangle, circular, or other shape. Each window 14 exposes an area of the surface of the silicon substrate 12. Subsequently, as shown in FIG. 2c, a recess 16 having four different (111) facets 18, 20, 22, 24 is formed in the silicon substrate in the region of each window 14. This is achieved by means of an anisotropic etching step, in this case anisotropic wet etching using KOH as the etchant. The four facets 18, 20, 22, 24 are each substantially flat and each in a respective one of the different (111) planes of the silicon, specifically one in each of the (111) 20, (-111) 24, (-1-11) 18 and (1-11) 22 planes. Each of these facets is inclined at less than 90° to the top (113) surface so that it faces partly upwards and partly inwards, and each is triangular having one edge along a respective top side of the recess and a point at the bottom of the recess. As the etching undercuts the $SiO_2$ film in some places, the top of the final recess is not exactly the same square shape as the windows 14, but in fact trapezoidal. The $SiO_2$ 10 is then removed as shown in FIG. 2d using dilute hydrofluoric acid.

Figure 2E:
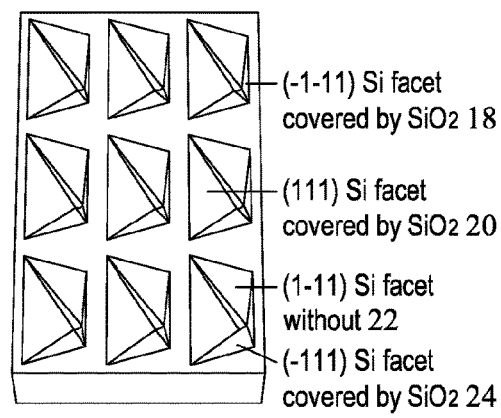

Next, as shown in FIG. 2e, $SiO_2$ is deposited on the (111), (-111) and (-1-11) facets and thus leave (1-11) facet uncovered. $SiO_2$ is also deposited on the areas between each recess (i.e. the un-etched part of (113) silicon). This can be simply achieved by using electron beam deposition, with an electron beam that is broad enough to cover the whole of the etched surface of the substrate, and tilting the patterned silicon so that its surface is not perpendicular to the direction of the electron-beam (EB) in the EB deposition chamber, and selecting the tilting angle so that the electron beam is incident on the (111), (-111) and (-1-11) facets, but not (or not to any significant amount) on the (1-11) facet. The final patterned silicon will be then used for growth of (11-22) GaN, and the growth will be performed only on the uncovered (1-11) facet by a typical procedure approach for GaN-on-silicon. In this embodiment the growth of GaN is achieved by an initial deposition of AlN layer on the exposed silicon facet, followed by growth of GaN layer. The growth will initially be on the exposed silicon facets in the direction in which those facets face. However as the growth around each exposed facet extends out of the recesses and across the (113) surface of the silicon, the GaN will merge to form a single continuous layer with a smooth surface in the (11-22) plane of the GaN structure, parallel to the original (113) silicon surface.

Figure 1:
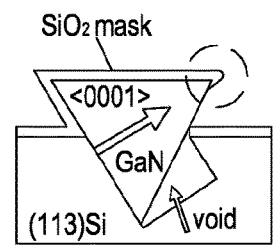
FIG. 1 shows a known two-step growth method using triangular section GaN strips.

The method of this embodiment for the fabrication of patterned (113) silicon is completely different from the inclined strip pattern approach described above with reference to FIG. 1. The method of this embodiment leads to an "open" configuration in which all of the facets forming the sides of the recesses face partly upwards so there are no overhanging sides to the recesses, and $SiO_2$ film can cover well all other facets except the (1-11) facet, eliminating the "Ga melting-back" issue. In contrast the inclined strip pattern approach of FIG. 1 is a kind of "closed" configuration and thus it is impossible to deposit $SiO_2$ to cover the (-11-1) facet, leaving a chance to generate "Ga melting-back", which is the fundamental limit for the inclined strip pattern approach.

Figure 3A:
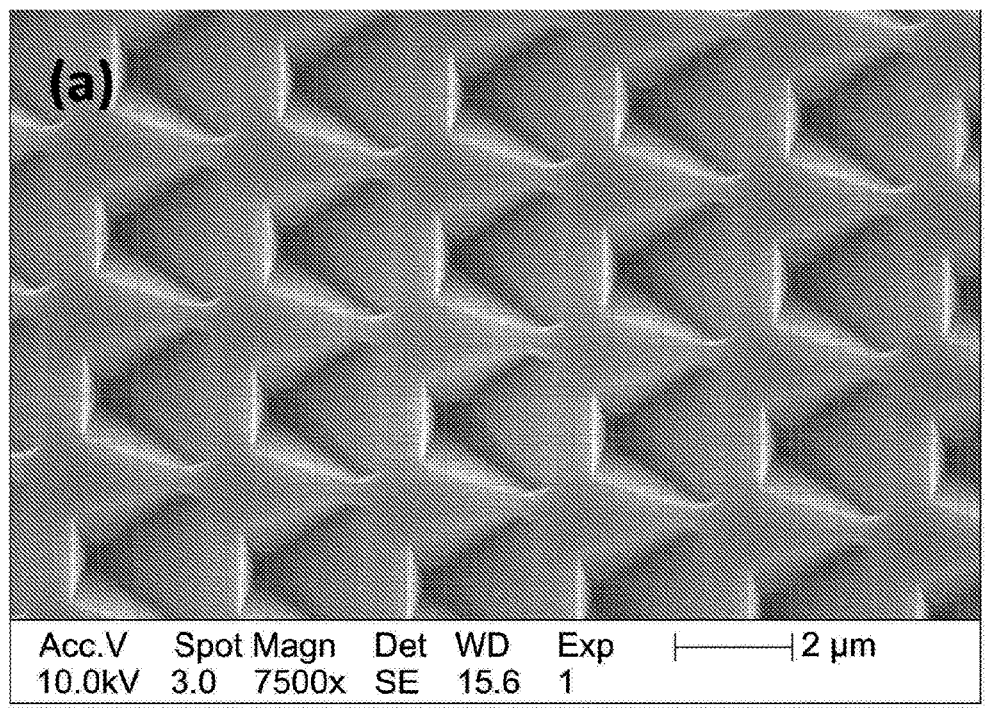
FIG. 3a is an SEM image of the patterned Si substrate of FIG. 2d.
Figure 3B:
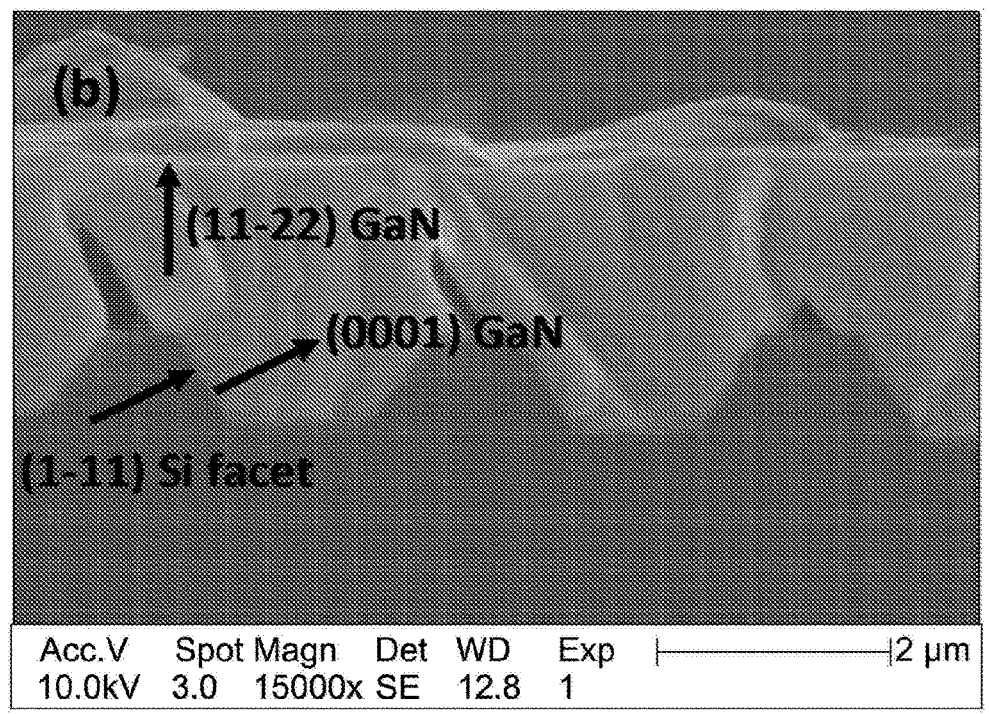
FIG. 3b is an SEM image of GaN grown only on the (1-11) Si facet of the substrate of FIG. 3a to form (11-22) GaN.

FIG. 3a shows a typical SEM plan-image of part of the patterned (113) silicon which extends across a two inch wafer, where four (111) facets have been formed in each window region with a size of 2×2 μm by KOH anisotropy wet etching as described above and shown in FIG. 2d. FIG. 3b shows a cross-sectional SEM image of (11-22) GaN grown on the patterned silicon of FIG. 3a, indicating that the GaN can be grown only on the (1-11) silicon facet. The GaN will grow as 0001 GaN in the direction perpendicular to the plane of the (1-11) silicon facet in each of the recesses. As the GaN grows, the growth in each recess grows out of the recess, and then spreads until it forms a continuous layer of GaN, with the (11-22) surface parallel to the initial (113) silicon surface. Further growth then forms (11-22) GaN along the vertical direction, i.e. perpendicular to the original (113) silicon surface. Further, the voids due to the coalescence of growth fronts have been clearly observed, which is expected to help reduce defects and strain relaxation. Examination the whole wafer by SEM, revealed no sign of "Ga melting back" etching. Further X-ray measurements have confirmed that only (11-22) GaN have been formed.

In various modifications to the embodiment described above, different Group III nitrides are grown on the same substrate. The method is the same as described above and the finished template corresponds to that shown in FIG. 3b. In further modifications, rather than a simple square array of apertures, the mask is modified so that the apertures are arranged in a rectangular array, and in another modification in a hexagonal array. In further modifications to these embodiments, the orientation of the apertures is changed, the apertures being rotated relative to the positions shown in FIG. 2b so that the sides of the apertures are not aligned with the direction of the rows of the apertures. In still further modifications the shapes of the apertures are varied, in some cases being rectangular, and in some cases, triangular or hexagonal.

The invention claimed is:

1. A method of growing a group Ill nitride crystal structure comprising the steps of:
   providing a silicon substrate;
   forming a first mask on the substrate with a plurality of apertures formed through the mask arranged in a 2D array, each of the apertures exposing a respective area of the silicon substrate;
   etching the silicon exposed by each of the apertures to form a respective recess having a plurality of facets;
   depositing a second mask over areas between the recesses and over some of the facets of each of the recesses leaving only one of the facets of each of the recesses exposed; and
   growing group III nitride on the exposed facets and then over the substrate to form a continuous layer covering the recesses.

2. The method according to claim 1 wherein the etching is performed using anisotropic wet etching.

3. The method according to claim 1 wherein each of the facets of each of the recesses is substantially triangular or trapezoidal.

4. The method according to claim 1 wherein each of the recesses has a bottom and tapers to a point at the bottom.

5. The method according to claim 1 wherein one of the facets of each of the recesses is a (1-11) facet which is left exposed for growth of the group III nitride thereon.

6. The method according to claim 5 wherein the group Ill nitride grows initially as (0001) group III nitride on the (1-11) silicon facet of each of the recesses, and the group III nitride then grows out of the recesses and merges to form a single layer of (11-22) group III nitride.

7. The method according to claim 1 wherein a buffer layer is deposited on the exposed facets prior to the growth of the group III nitride.

8. The method according to claim 1 wherein the apertures are arranged in a regular 2D array.

9. The method according to claim 1 wherein the group III nitride is at least one of GaN, AlGaN, InGaN, and AlN.

* * * * *